United States Patent
Lachner

(10) Patent No.: US 7,141,479 B2
(45) Date of Patent: Nov. 28, 2006

(54) BIPOLAR TRANSISTOR AND METHOD FOR PRODUCING THE SAME

(75) Inventor: Rudolf Lachner, Ingolstadt (DE)

(73) Assignee: Infineon Technologies AG, Munich (DE)

( * ) Notice: Subject to any disclaimer, the term of this patent is extended or adjusted under 35 U.S.C. 154(b) by 62 days.

(21) Appl. No.: 10/862,012

(22) Filed: Jun. 4, 2004

(65) Prior Publication Data

US 2005/0020023 A1    Jan. 27, 2005

Related U.S. Application Data

(63) Continuation of application No. PCT/EP02/11427, filed on Oct. 11, 2002.

(30) Foreign Application Priority Data

Dec. 4, 2001  (DE) ................................. 101 59 414

(51) Int. Cl.
*H01L 21/331* (2006.01)
(52) U.S. Cl. ...................................... 438/311; 438/318
(58) Field of Classification Search ................. 438/311
See application file for complete search history.

(56) References Cited

U.S. PATENT DOCUMENTS

| | | | |
|---|---|---|---|
| 3,600,651 A | 8/1971 | Duncan | |
| 5,134,454 A * | 7/1992 | Neudeck et al. | 257/587 |
| 5,349,228 A * | 9/1994 | Neudeck et al. | 257/365 |
| 5,599,723 A | 2/1997 | Sato | |
| 5,656,514 A | 8/1997 | Ahlgren et al. | |
| 5,962,879 A | 10/1999 | Ryum et al. | |
| 6,180,442 B1 * | 1/2001 | Gris | 438/202 |
| 6,362,066 B1 | 3/2002 | Ryum et al. | |
| 6,462,397 B1 | 10/2002 | Ryum et al. | |

2002/0058388 A1   5/2002  Ryum et al.

(Continued)

FOREIGN PATENT DOCUMENTS

DE    100 04 067 A1    3/2001

(Continued)

OTHER PUBLICATIONS

Nii et al., A 67 GHz fmax Lateral Bipolar Transistor Co-silicid Base Electrode Structure on Thin Film SOI for RF Analog Applications, in Maes, H. etc., ESSDERC '99, Proceedings of the 29th European Solid-State Device Research Conference, Leuven '99, pp. 212-215 (4 pages).

(Continued)

*Primary Examiner*—B. William Baumeister
*Assistant Examiner*—Matthew L. Reames
(74) *Attorney, Agent, or Firm*—Maginot, Moore & Beck

(57) ABSTRACT

A method for producing a bipolar transistor is described, which comprises providing a layer sequence, which comprises a substrate, a first oxide layer and a SOI layer, generating a collector region in the substrate, generating a second oxide layer on the layer sequence, generating a base region in the first oxide layer, such that the base region is in contact with the SOI layer, generating an emitter region on the base region such that the emitter region is isolated from the SOI layer, and generating a collector contact, a base contact and an emitter contact. The present invention is based on the knowledge that the production of a bipolar transistor can be made significantly less expensive when the above layer sequence is used for its production, and thereby, the base region is generated in the BOX layer while the collector region is formed in the substrate. Thereby, otherwise required production process steps and particularly layer deposition steps, such as for a polysilicon or oxide layer, are saved.

11 Claims, 3 Drawing Sheets

U.S. PATENT DOCUMENTS

2003/0162350 A1    8/2003    Muller et al.

FOREIGN PATENT DOCUMENTS

EP    0 287 318 A2    10/1988
EP    1 152 462 A1    11/2001

OTHER PUBLICATIONS

Washio et al., "A 0.2-μm 180-GHz-$f_{max}$ 6.7-ps-ECL SOI/HRS Self-Aligned SEG SiGe HBT/CMOS Technology for Microwave and High-Speed Digital Applications", IEDM 2000, pp. 741-744, (4 pages).

Klein et al., "75 GHz Bipolar Production-Technology for the 21$^{st}$ Century", in Maes, H. etc., ESSDERC '99, Proceedings of the 29$^{th}$ European Solid-State Device Conference, Leuven '99, pp. 88-94, (7 pages).

"Novel Selective EPI Base for Double-Poly Structures", IBM Technical Disclosure Bulletin vol. 35 No. 2, Jul. 1992, pp. 51-53, (3 pages).

Siekkinen et al., "Selective Epitaxial Growth Silicon Bipolar Transistors for Material Characterization", IEEE Transactions on Electron Devices, vol. 35, No. 10, Oct. 1988, (5 pages).

Neudeck, G., "A New Epitaxial Lateral Overgrowth Silicon Bipolar Transistor", IEEE Electron Device Letters, vol. EDL-8, No. 10, Oct. 1987, (4 pages).

Shahidi, G., etc., "Mainstreaming of the SOI Technology", in Maes, H. etc., ESSDERC '99, Proceedings of the 29th European Solid-State Device Research Conference, Leuven '99, (9 pages).

* cited by examiner

ND METHOD FOR
BIPOLAR TRANSISTOR AND METHOD FOR PRODUCING THE SAME

CROSS-REFERENCE TO RELATED APPLICATION

This application is a continuation of copending International Application No. PCT/EP02/11427, filed Oct. 11, 2002, which designated the United States and was not published in English.

BACKGROUND OF THE INVENTION

1. Field of the Invention

The present invention relates to bipolar transistors and particularly to vertical bipolar transistors in SOI technology as well as the production of the same.

2. Description of the Prior Art

When applying bipolar transistors in the analog domain, high demands are made on noiselessness, high-speed and high-frequency capability, respectively, and the power consumption of bipolar transistors. Additionally, for cost reduction, there is the desire to be able to produce bipolar transistors via standard methods, such as in CMOS technology (CMOS=complementary metal oxide semiconductor).

In H. Nii, etc., "A 67 GHz fmax Lateral Bipolar Transistor with Co-silicid Base Electrode Structure on Thin Film SOI for RF Analog Applications", in Maes, H. etc., ESSDERC '99, Proceedings of the 29th European Solid-State Device Research Conference, Leuven '99, pp. 212–215, a lateral bipolar transistor in SOI technology is described. The production of the bipolar transistor starts from an SOI substrate consisting of a SOI (silicon on isolator) layer and a BOX (BOX=buried oxide) layer. First, N⁻ collector ions are implanted in the SOI layer. Then, a polysilicon layer is deposited on the SOI layer and implanted with $BF_2$. Apart from a small lateral area, the polycrystalline layer and the monocrystalline silicon of the SOI layer are etched into the SOI layer. A lateral NPN bipolar transistor is realized in the SOI layer by tilted B and $BF_2$ implantation and implantations of emitter and collector ions. A Co-silicide base electrode is formed at the polysilicon layer as base terminal.

In K. Washio, "A 0.2-μm 180-GHZ-$f_{max}$ 6.7-ps-ECL SOI/HRS Self-Aligned SEG SiGe HPT/CMOS Technology for Microwave and High Speed Digital Application", IEDM 2000, pp. 741–744, a CMOS heterostructure bipolar transistor on SOI base is described, where a collector well is formed in the SOI layer and where the base, base terminal and emitter region are formed by polysilicon deposition, so that this heterostructure bipolar transistor has a double polysilicon layer structure.

In W. Klein, etc., "75 GHz Bipolar Production-Technology for the 21st Century", in Maes, H. etc., ESSDERC '99, Proceedings of the 29th European Solid-State Device Research Conference, Leuven '99, pp. 88–94, a bipolar transistor is described, whose structure corresponds to the one shown in FIG. 3. The bipolar transistor 500 shown in FIG. 3 consists of a p substrate 502, an oxide layer 504, a polysilicon layer 506, a second oxide layer 508, an isolation layer 510 and a metal layer 518, which have been processed appropriately, to result in the bipolar transistor 500.

The bipolar transistor 500 as shown in FIG. 3 requires the following production steps for its construction. First, oxide ridges 520a, 520b and 520c are formed in the p substrate 502 by a Locos method or a trench isolation technique (STI; STI=shallow trench isolation). Then, an n collector well 522 is formed in the p substrate by high-energy implantation. The oxide layer 504 is deposited on this structure. Then, the polysilicon layer 506 is deposited on the layer 504 and subjected to a p⁺ doping. Subsequently, the second oxide layer 508 and a further layer (not shown in the final state in FIG. 3, since it will be removed prior to completion) are deposited on the layer 506. Then, the stack of layers 508, 506 and 504 will be structured appropriately to form a base terminal 524 of the polysilicon layer 506 and a hole 526 in the stack of layers 506, 508 and the layer of nitride. A nitride sidewall spacer, which defines an emitter window 530, is generated in the hole 526 by an appropriate method. Through the emitter window 530, a base region 532 is formed by wet etching, wherein an epitaxy base region 532 is formed by selective epitaxial growth. After a nitride removal, where the nitride layer, which is not shown, is removed, and a further generation of a spacer 528, n doped polycrystalline silicon is deposited and structured to form an emitter region 534. By depositing the isolation layer 510, providing vias 536, 538 and 540 for contacting the base terminal 524, the emitter region 534 and the n collector well 522, respectively, and by providing the metal contacts 542, 544 and 546 in the metal layer 518, the production of the bipolar transistor 500 is completed.

The disadvantage of the bipolar transistor shown in FIG. 3 is its relatively expensive production. Particularly, five layers have to be deposited on the substrate 502 for producing the bipolar transistor, namely the oxide layer 504, the polysilicon layer 506, the second oxide layer 508, the nitride layer and the polycrystalline material of the emitter terminal 534.

SUMMARY OF THE INVENTION

It is the object of the present invention to provide a bipolar transistor and a method for producing the same, which are less expensive.

In accordance with a first aspect, the present invention provides a method for producing a bipolar transistor, comprising: providing a layer sequence, which comprises a substrate, a first oxide layer and a monocrystalline SOI layer; generating a collector region in the substrate; generating a second oxide layer on the layer sequence; generating a base region in the first oxide layer, such that the base region is in contact with the monocrystalline SOI layer; generating an emitter region on the base region, such that the emitter region is isolated from the monocrystalline SOI layer; and generating a collector contact, a base contact and an emitter contact.

In accordance with a second aspect, the present invention provides a bipolar transistor, having a layer sequence, which comprises a substrate, an oxide layer and an SOI layer; a collector region in the substrate; a second oxide layer on the layer sequence; a base region in the first oxide layer, which is in contact with the SOI layer; an emitter region on the a base region, which is isolated from the SOI layer; and a collector contact, a base contact and an emitter contact.

The present invention is based on the knowledge that the production of a bipolar transistor can be designed significantly less expensive when a layer sequence consisting of a substrate, a BOX layer and a SOI layer is used for its production, and the base region is generated in the BOX layer while the collector region is formed in the substrate. Thereby, otherwise required production process steps are saved, particularly layer deposition processes, such as for a polysilicon or oxide layer.

It is a further advantage of the present invention, that the monocrystalline SOI layer on top of the BOX layer can be used as base terminal layer. Apart from saving one process step of the depositing a respective polysilicon layer, as in the conventional bipolar transistor shown in FIG. 3, due to the fact that the base terminal layer is formed of monocrystalline silicon, a realization of significantly lower external base resistors results, which is particularly important for low-noise applications.

It is another advantage of the present invention that it enables the integration of a vertical bipolar transistor on a thin SOI substrate. Particularly, the silicon layer and the SOI layer, respectively, on the BOX layer can be very thin, since it merely has to serve as base terminal layer, and, if necessary, is only used for producing resistors. Since the SOI layer can be significantly thin, FD (fully depleted) and PD (partially depleted) CMOS transistors can be integrated in the same.

It is another advantage of the present invention that the inventive bipolar transistor and the inventive method for producing the same can be integrated and are compatible, respectively, with standard CMOS methods. Particularly, the present invention can be used with standard SOI material, as it is intended for usage with the CMOS technology, whereby effectively a BiCMOS technology on SOI base results.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

According to FIG. 1, the structure of a bipolar transistor according to an embodiment of the present invention is described, while its production will be described with reference to FIG. 2.

Figure 1:
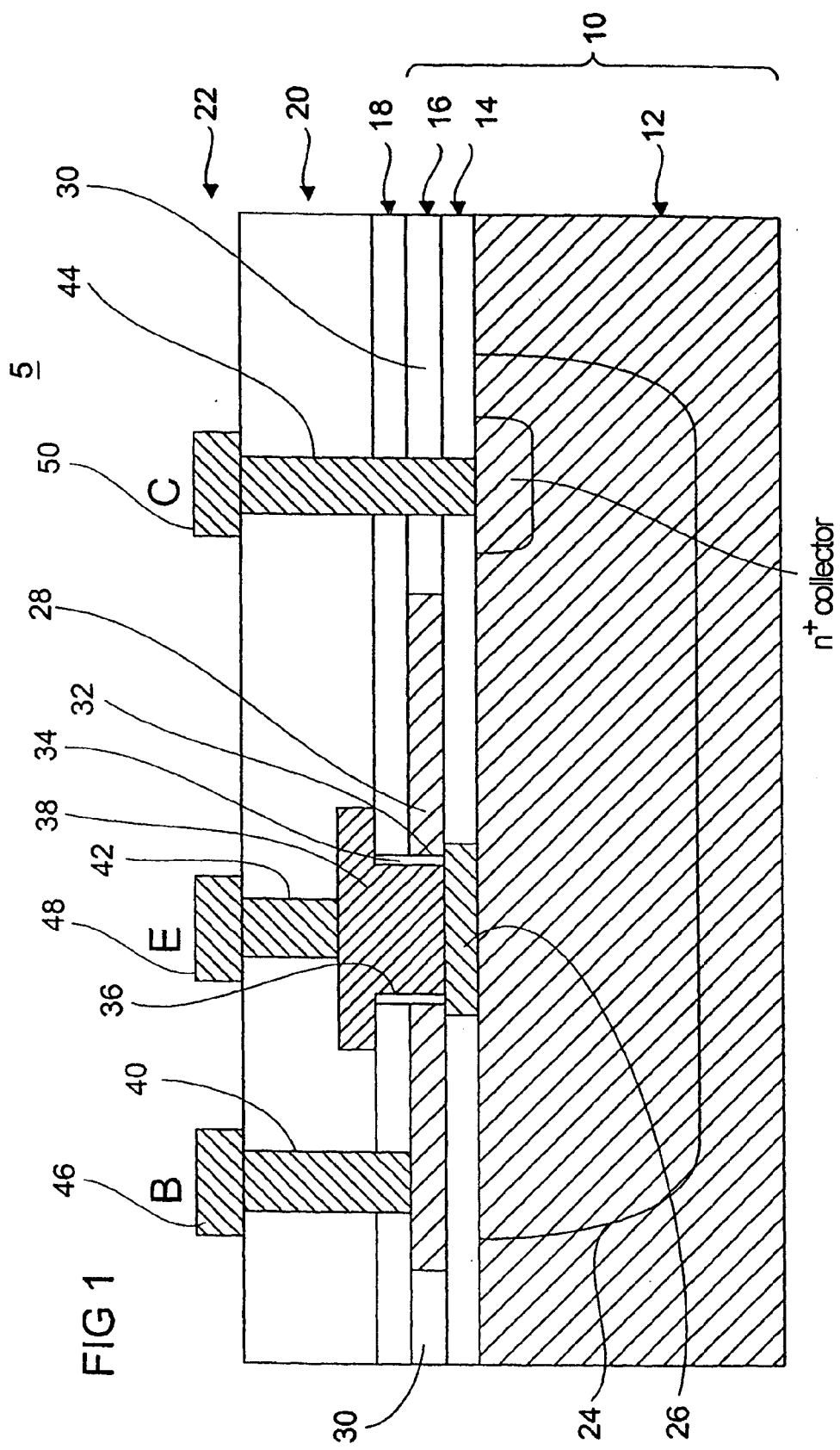
FIG. 1 is a cross section of a bipolar transistor according to an embodiment of the present invention.

The bipolar transistor of FIG. 1 is a vertical bipolar transistor 5 with epitaxial base, which is produced in SOI technique. The bipolar transistor consists mainly of a layer sequence 10, which comprises a p substrate 12, a BOX layer and a first oxide layer 14, respectively, and a SOI layer 16, wherein the BOX layer 14 is disposed between the SOI layer 16 and the p substrate 12. Further, the bipolar transistor 5 comprises a second oxide layer 18 on the SOI layer 16 and an oxide isolation layer 20 on the second oxide layer 18. A structured metal layer 20 is disposed on the isolation layer 20.

The p substrate serves as transistor substructure. In the p substrate, a doped region of an n collector well 24 is formed. On top of that, an epitaxial Si or SiGe base area and an epitaxial Si or SiGe base region 26, respectively, resides in the BOX layer. A base terminal region 28 is formed in the SOI layer 16 disposed on the BOX layer 14. The base terminal region 28 is p doped and consists of monocrystalline silicon, since it is part of the SOI layer 16. The base terminal region 28 is designed ring-shaped or frame-shaped, wherein a STI trench region 30 resides outside of the same in the SOI layer 16. Inside the base terminal region 28, there is an opening region 32, within which the base terminal region 28 is interrupted. The opening region 32 extends also across the second oxide layer 18, so that it is also interrupted across the lateral extension of the opening region 32. The lateral extension of the opening region 32 extends merely across part of the lateral extension of the base region 26, so that a further part of the base region 26 extends between the base terminal region 28 and the p substrate 12, whereby the base region 26 is in contact with the base terminal region 28. The contact between the base region 26 and the base terminal region 28 is established between an outer margin region of a surface of the base region 26 and an inner margin region of an adjacent surface of the base terminal region 28. The opening region 32 defines a sidewall along which a spacer and spacing element 34, respectively, extends, which surrounds and defines, respectively, an emitter window 36. An emitter region 38 is formed in the emitter window 36, which contacts the base region 26, is isolated from the base terminal region 28 by the spacing element 32, extends partly across the second oxide layer 18 and serves both as emitter and as emitter terminal. Vias 40, 42 and 44 consisting of a tungsten filling extend vertically from the upper surface of the isolation layer 20 facing away from the second oxide layer 18 to the base terminal region 28, the emitter region 38 and the n collector well 24, respectively. Thereby, the vias 40–44 connect the base terminal region 28, the emitter region 38 and the n collector well 24 with a base contact 46, emitter contact 48 and collector contact 50, respectively, formed in the metal layer 22.

The bipolar transistor 5 of FIG. 1 represents a vertical NPN bipolar transistor, which is both integratable on the SOI material and comprises an epitaxial SOI or SiGe base. Since the base terminal region 28 is formed of the monocrystalline silicon of the SOI layer 16 of the layer sequence 10, the bipolar transistor 5 is very well suited for low-noise applications due to the realization of significantly lower external base resistances.

Since merely the base terminal region 28 is formed in the SOI layer 16, this layer can be formed very thin. The thickness of the p doped SOI layer is, for example, 150 nm, while the thickness of the BOX layer is 100 nm.

Additionally, the bipolar transistor 5 is compatible with CMOS technology. Therefore, the bipolar transistor 5 can be integrated in CMOS circuits. When the bipolar transistor 5 is integrated in CMOS circuits, resistors and FD and PD CMOS transistors, respectively, can be integrated in the thin SOI layer 16. Thereby, the source and drain terminal of the CMOS transistor are formed in the epitaxial SOI layer. With regard to the integration of FETs in thin SOI layers in standard CMOS technology, reference is further made to Shahidi, G., etc., "Mainstreaming of the SOI Technology", in Maes, H. etc., ESSDERC '99, Proceedings of the 29th European Solid-State Device Research Conference, Leuven '99, pp. 3–10 which is incorporated herein by reference.

In the following, the production of the bipolar transistor of FIG. 1 will be described according to an embodiment of the present invention with reference to FIG. 2, wherein reference is also made to FIG. 1.

The production method starts at step 100 with the provision of the SOI layer sequence 10. The thickness of the SOI layer 16 is, for example, 150 nm, while the thickness of the BOX layer 14 is 100 nm. The monocrystalline silicon of the SOI layer 16 is p[+] doped, wherein it is further possible, however, that the doping is performed later in a subsequent process step.

In a step 105, an appropriate implantation of the p substrate 12 is performed to form the collector well 24 and the p substrate 12. The implantation is performed, for example, via high-energy phosphor implantation. The implantation can also consist of several steps to generate a structure of regions with different dopings in the collector well 24. In step 105, for example, the doping of the SOI layer 16 could be performed.

In a step 110, the SOI layer 16 is subjected to an STI formation, whereby the base terminal region 28 is formed of the material of the SOI layer 16 and the STI trench region 30 is formed of an oxide. The step 110 can, for example, be performed by structuring the SOI layer 116 to form the base terminal region 28 and a trench for the trench region 30, and a TEOS method (TEOS=tetra ethyl ortho silicate) for filling the trench for the trench region 30 for forming the STI trench region 30. The structuring of the base terminal region 28 concerns here only its outside dimensions.

Then, in a step 115, the second oxide layer 18 is deposited on the SOI layer 16.

In a step 120, a further nitride layer (not shown in FIG. 1, since the same is removed prior to the completion of the bipolar transistor 5) is deposited on the second oxide layer 18.

In a step 125, the stack of nitride layer, oxide layer 18 and SOI layer 16 is structured to form the opening region 32 and the hole for the emitter window 36, respectively. The structuring in step 125 can be performed, for example, by etching with an etch stop at the oxide layer 14. The width of the hole and the opening region 32, respectively, is approximately 0.5 µm.

In a step 130, an nitride sidewall spacer is formed on the sidewall of the hole and the opening region 32, respectively, by which the deposition of Si or SiGe on the sidewall in the subsequent steps is to be prevented. Generating the spacing element and spacer, respectively, is performed by an appropriate technique, such as the TEOS method.

In a step 135, the oxide of the BOX layer 14 is removed at the opening region 32 to form a window for the base region 26. The removal can be performed, for example, via wet etching or another isotrope etching step. By undercutting the SOI layer 16, it is achieved that the window for the base region 26 extends between the base terminal region 28 and the p substrate 12, so that the base region 28 generated in the window in the subsequent step comes into contact with the base terminal region 28.

In a step 140, Si or SiGe is deposited in the window for the base region 26 by selective epitaxial growth, whereby the epitaxial base region 28 is generated. The base doping is preferably performed during epitaxy, whereby the doping profile can be set steeper.

In a step 145, the nitride layer (not shown) is removed to generate the final nitride sidewall spacer 34 in a subsequent next step 150, which defines the emitter window 36, which has, for example, merely a width of 0.25 µm.

In a step 155, an n, such as arsenic, doped polysilicon is deposited and structured on the base region 26 in the emitter window 36 as well as on the oxide layer 18, to form the emitter region 38.

Thereupon, oxide is deposited in a step 166 to form the isolation layer 20.

Then, in a step 165, the tungsten vias 40, 42, 44 are produced by generating vias, which extend vertically from the outer surface of the isolation layer 20 to the base terminal 28, emitter 38 and collector region 24 and then providing the same with a tungsten filling.

In a step 170, the emitter, collector and base contacts 46, 48 and 50 are structured, which are connected to the vias 40–44.

Figure 2:
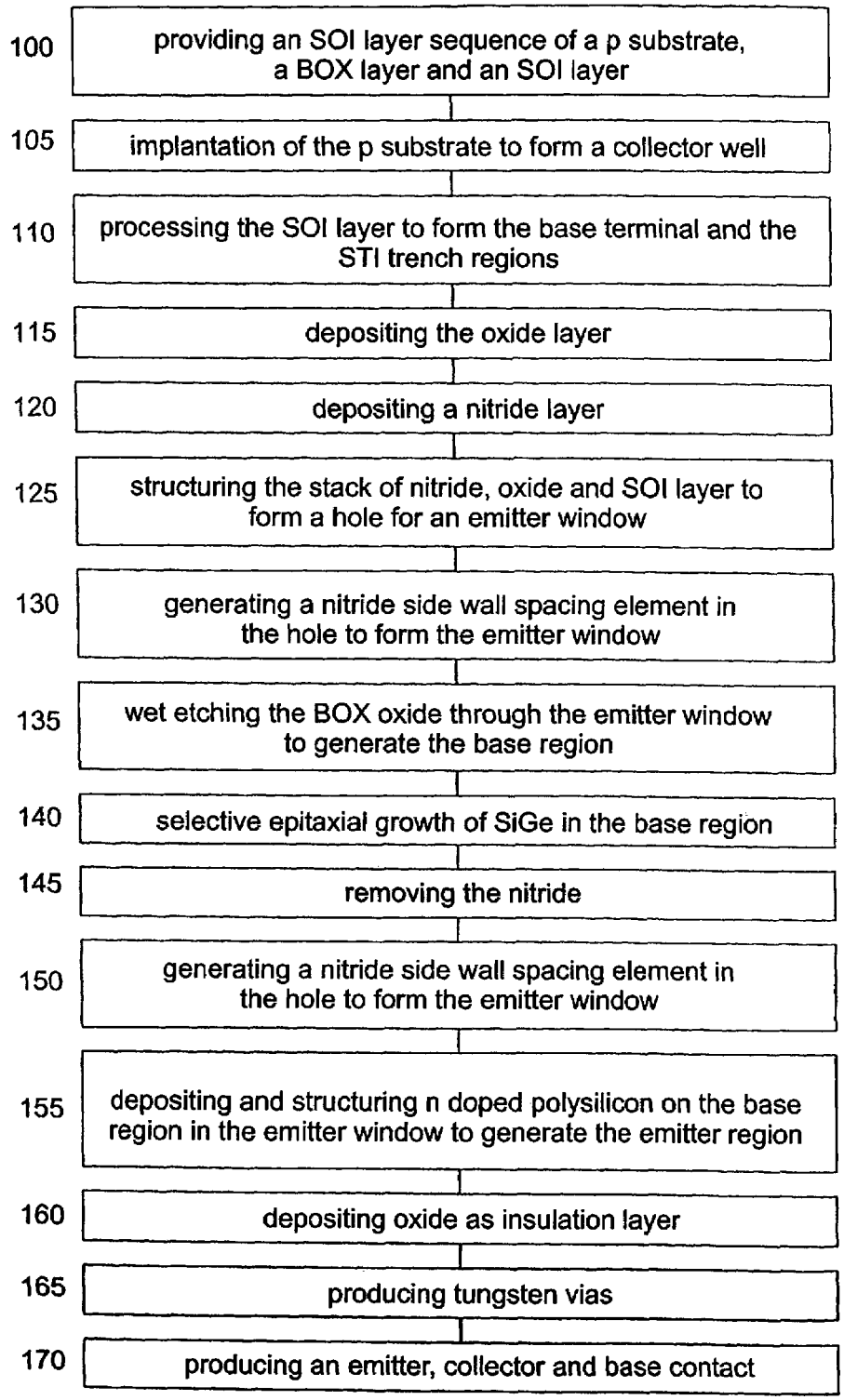
FIG. 2 is a flow diagram showing the steps for producing the bipolar transistor of FIG. 1 according to an embodiment of the present invention.

It should be noted that the order of the production steps of FIG. 2 can be changed. Steps 105 to 120, for example, could be swapped. With reference to step 110, it should be noted that the same can also be omitted, i.e. that the bipolar transistor 5 does not need to have STI trench regions 30, such as in the case where the bipolar transistor 5 is not to be combined with a standard SOI CMOS method and is not to be integrated in a CMOS circuit, respectively.

With reference to the form of the base terminal region 28, it should be noted that the same does not have be formed ring shaped and frame-shaped, respectively. It is only required that a lateral overlapping exists with the base region 26 in order to establish contact between the same. With reference to the above-mentioned used materials and dopings, such as particularly the collector well 25, the base region 26, the base terminal region 28, the emitter region 38 and the vias 40, 42 and 44 it should be noted that the same can be varied. Particularly, the above description is also applicable to pnp bipolar transistors, in that case, the above indicated conductor types are reversed.

Figure 3:
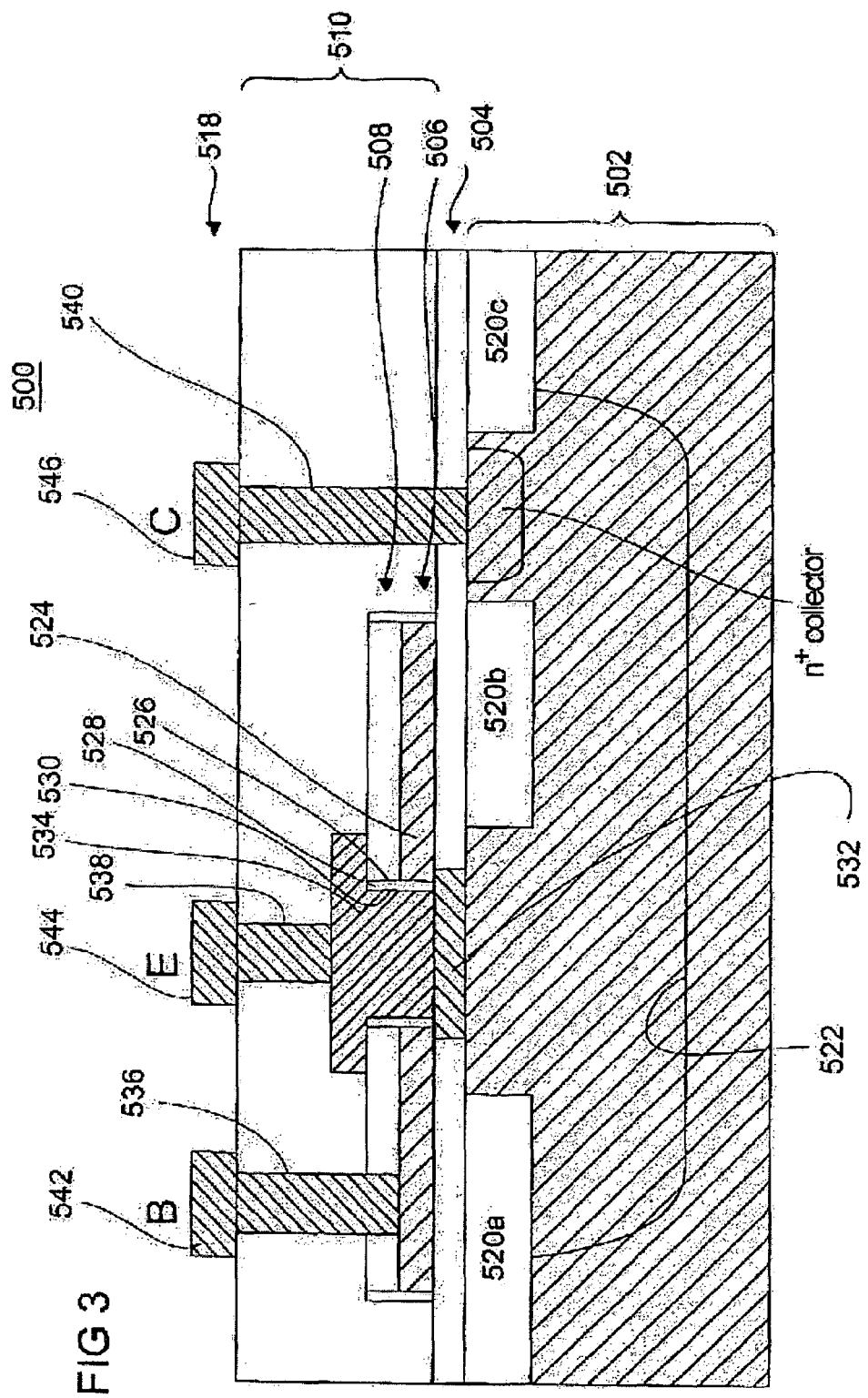
FIG. 3 is a cutaway view of a conventional bipolar transistor.

In comparison to the bipolar transistor of the conventional type from FIG. 3, the above-described bipolar transistor has, the advantage, that the number of process steps in production is reduced, whereby the cost of the bipolar transistor is reduced. Additionally, the emitter terminal region 28 consists of monocrystalline silicon, whereby significantly lower external base resistors can be realized, and thereby, the applicability for low noise applications is improved.

In comparison to the heterostructure bipolar transistor mentioned in the introduction of the description, there is the advantage that the base is an epitaxial base, that the SOI layer can be thinner due to the fact that merely the base terminal region and not the collector is formed in the same and that a lower number of deposition and growth production steps is required for production, since merely the base region 26 and the emitter region 38 have to be deposited, while the base terminal region is already present by the SOI layer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE NUMBER LIST 5 bipolar transistor
10 layer sequence
12 p substrate
14 BOX layer
16 SOI layer
18 second oxide layer
20 isolation layer
22 metal layer
24 n collector well
26 base region
28 base terminal region
30 STI trench region
32 opening region
34 spacer
36 emitter window
38 emitter region
40 via 42 via
44 via
46 base contact
48 emitter contact
50 collector contact
500 bipolar transistor
502 p substrate
504 first oxide layer
506 polysilicon layer
508 second oxide layer
510 isolation layer
518 metal layer
520a STI trench region
520b STI trench region
520c STI trench region
522 n collector well
524 base terminal region
526 hole
528 spacer
530 emitter window
532 base region
534 emitter region
536 via
538 via
540 via
542 base contact
544 emitter contact
546 collector contact

What is claimed is:

1. A method for producing a bipolar transistor, comprising:
 (a) providing a layer sequence, which comprises a substrate, a first oxide layer and a monocrystalline SOI layer;
 (b) generating a collector region in the substrate;
 (c) generating a second oxide layer on the layer sequence;
 (d) generating a base region in the first oxide layer, such that the base region is in contact with the monocrystalline SOI layer;
 (e) generating an emitter region on the base region, such that the emitter region is isolated from the monocrystalline SOI layer; and
 (f) generating a collector contact, a base contact and an emitter contact, and
 wherein between step (b) and (c) the monocrystalline SOI layer is structured to generate a base terminal region from the monocrystalline SOI layer and a trench region.

2. The method according to claim 1, wherein step (b) comprises a high-energy implantation to generate a collector well in the substrate as collector region.

3. The method according to claim 1, which comprises the following step after the monocrystalline SOI layer is structured:
 forming a trench isolation in the trench region.

4. The method according to claim 1, wherein step (c) is performed prior to step (b).

5. The method according to claim 1, wherein the step (d) further comprises the following steps:
 (d1) structuring the second oxide layer and the monocrystalline SOI layer to expose part of a surface of the first oxide layer, which faces the substrate;
 (d2) partly removing the first oxide layer to generate a window, which extends partly across the part of the surface of the first oxide layer, partly between the monocrystalline SOI layer and the substrate and partly across the collector region;
 (d3) forming the base region in the window.

6. The method according to claim 5, wherein step (d2) comprises wet etching of the first oxide layer from the exposed part of the surface.

7. The method according to claim 5, wherein step (d3) comprises epitaxial growth to generate an epitaxial base region.

8. The method according to claim 5, wherein step (d) further comprises the following step:
 between steps (d1) and (d2), forming an isolating spacing element along a sidewall of the SOI layer, which surrounds the exposed part of the surface of the first oxide layer.

9. The method according to claim 1, wherein step (e) further comprises the following step:
 (e1) depositing Polysilicon on a part of the base region.

10. The method according to claim 9, wherein step (e) further comprises the following step:
 (e2) prior to step (e1), forming an isolating spacing element between a margin of part of the base region and the sidewall of the SOI layer, which surrounds the part of the base region.

11. The method according to claim 1, wherein step (f) further comprises the following steps:
 (f1) contacting the collector contact with the collector region;
 (f2) contacting the base contact with the monocrystalline SOI layer; and
 (f3) contacting the emitter contact with the emitter region.

* * * * *